United States Patent [19]

Fazan et al.

[11] Patent Number: 5,358,894
[45] Date of Patent: Oct. 25, 1994

[54] OXIDATION ENHANCEMENT IN NARROW MASKED FIELD REGIONS OF A SEMICONDUCTOR WAFER

[75] Inventors: Pierre Fazan; Viju Mathews; Gurtej S. Sandhu; Mohammed Anjum; Hiang C. Chan, all of Boise, Id.

[73] Assignee: Micron Technology, Inc., Boise, Id.

[21] Appl. No.: 175,481

[22] Filed: Dec. 30, 1993

Related U.S. Application Data

[63] Continuation of Ser. No. 832,142, Feb. 6, 1992, abandoned.

[51] Int. Cl.$^5$ ............................................. H01L 21/76
[52] U.S. Cl. ..................................... 437/70; 437/69; 148/DIG. 163; 148/DIG. 116
[58] Field of Search ............................. 437/69, 70; 148/DIG. 163, DIG. 116

[56] References Cited

U.S. PATENT DOCUMENTS

| | | | |
|---|---|---|---|
| 4,728,619 | 3/1988 | Pfiester et al. | 437/70 |
| 4,743,563 | 5/1988 | Pfiester et al. | 437/70 |
| 4,748,134 | 5/1988 | Holland et al. | 437/70 |
| 4,912,062 | 3/1990 | Verma | 437/69 |
| 4,957,873 | 9/1990 | Ojha et al. | 437/69 |
| 5,077,230 | 12/1991 | Woo et al. | 437/69 |
| 5,128,274 | 7/1992 | Yabu et al. | 437/70 |
| 5,137,843 | 8/1992 | Kim et al. | 437/70 |

*Primary Examiner*—Brian E. Hearn
*Assistant Examiner*—Trung Dang
*Attorney, Agent, or Firm*—Stanley N. Protigal

[57] ABSTRACT

A LOCOS process is enhanced by enhancing the depth of field oxide in regions having a narrow field oxide width. Subsequent to forming a pattern of nitride to define the field oxide and active area, photoresist is applied to selected areas of the wafer. An impurity is then applied to the underlying semiconductor substrate in areas not protected by photoresist and nitride. The impurity results in an enhanced oxidation rate and therefore compensates for a thinning effect in selected field oxide areas, such as those having a narrow width. Subsequent formation of the field oxide results in the doped material being consumed by the oxide.

9 Claims, 5 Drawing Sheets

OXIDATION ENHANCEMENT IN NARROW MASKED FIELD REGIONS OF A SEMICONDUCTOR WAFER

This application is a continuation of application Ser. No. 07/832,142, filed Feb. 6, 1992, now abandoned.

FIELD OF THE INVENTION

This invention relates to fabrication of semiconductor circuit devices and more particularly to differential control of field oxide thickness. The invention is directed to techniques for reducing a thinning of field oxide which occurs in narrow field regions of semiconductor circuit devices having both narrow and wide field regions. The invention has particular utility in memory arrays such as dynamic random access memories (DRAMs).

BACKGROUND OF THE INVENTION

This invention relates to the manufacture of multilayer semiconductor circuit devices, in which the growth of field oxide regions serves to isolate devices on a circuit array.

The invention uses various materials which are electrically either conductive, insulating or semiconducting, although the completed semiconductor circuit device itself is usually referred to as a "semiconductor". One of the materials used is silicon, which appears as either single crystal silicon or as polycrystalline silicon material, referred to as polysilicon or "poly" in this disclosure.

While silicon is used in the preferred embodiment, as is known to those skilled in the art of semiconductor manufacture, the invention is applicable to other doped semiconductor material.

An electronic circuit is chemically and physically integrated into a substrate such as a silicon wafer by patterning regions in the substrate, and by patterning layers on the substrate. These regions and layers can be conductive, for conductor and resistor fabrication. They can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n" denotes silicon that has been doped with atoms having more than four valence electrons (group V or higher), such as arsenic or phosphorus, which introduce negatively charged majority carriers into the silicon, and "p" denotes silicon doped with atoms having less than four valence electrons (group III or lower), such as boron, which introduce positively charged majority carriers. The majority charge carrier type is also referred to as conductivity type. A plus or minus superscript on an n or p indicates heavy or light doping, respectively. "Poly" denotes polycrystalline silicon.

A process known as LOCal Oxidation of Silicon (LOCOS) has become the standard device isolation technique, due to the semi-recessed topography of the field oxide, low defect density, and the self-aligning nature of the field implant, particularly in n-channel field regions. With conventional LOCOS technology, array area is wasted in oxide transition regions known as the "bird's beak" regions. A very gradual slope of the bird's beak region not only wastes space, but also hampers subsequent fine-line lithography operations which, for VLSI devices, is best suited to planar surface topography.

One of the more basic improvements to LOCOS which results in somewhat more planar surface topography and a reduction in the size of the bird's beak region is the etchback process. The effectiveness of this technique is limited by two factors—an increase in the effective size of the field implant encroachment region and the degree of remaining surface nonplanarity following the etchback.

One key factor in maximizing the active area is reducing field oxide encroachment into active area during field oxidation. Encroachment can case a loss of active width up to twice the field ox thickness. As geometries shrink in more advanced generation DRAMs, this effect becomes a dominant factor. A common method of approaching this problem involves use of some sort of field oxidation encroachment reduction technique. Several techniques are discussed in the literature including SWAMI, SILO, BOX, Poly Buffer, Nitrox, trench isolation, and others. Each has their advantages and disadvantages, but all involve adding a great deal of added complexity to the process.

The cause of field oxide bird's beak effect (bird's beak) initiates from process steps used to isolate an active area location of a storage cell. The Local Oxidation Of Silicon (LOCOS) process, a method commonly used to isolate active areas in a memory array during the production of a semiconductor device (LSI, VLSI, etc.), constitutes the use of thick field oxide.

Initially, the silicon wafer is prepared using conventional process steps such as those used for defining and forming CMOS wells. This is followed by growing a thin layer of pad oxide, usually silicon dioxide, over the wafer surface. Next, a layer of nitride is deposited on the wafer which is then patterned and etched away from all areas except those defined as active areas. Field oxide is then grown over the areas that were not previously covered with nitride and as it grows it begins to encroach under the edge of the nitride layer.

This oxide encroachment under the nitride, known as bird's beak, results in the actual area of the active areas being reduced after field oxidation is complete. Therefore, reducing bird's beak becomes a critical factor in maximizing the cell's active areas.

As geometries shrink in more advanced generation DRAMs, bird's beak becomes a dominant limiting factor to the number of cells that can effectively be packed into a given die.

The outer limits of the LOCOS process is the result of field oxide thinning in narrow field regions that results from a poor oxidant supply in these narrow regions. This invention has, as one of its objects, the reduction of this thinning effect.

The thinning effect is the result of the close proximity of two nitride sidewalls. Experience shows that a field width of 4000 Å will be subject to this thinning effect, although significant thinning may occur on field areas wider than that. The actual cause of the field oxide thinning is not clear, though.

One possibility is that, as a result of the narrow dimension, there is a reduced supply of oxidant species available for field oxide growth. A second possible factor is that, because of the narrow width, a different stress occurs on the oxidizing Si in the narrow regions, as a sort of reverse birds beak effect.

A third possibility is that the oxidation requires mobile oxygen molecules to enter the oxide forming over the Si at a preferred angle of incidence in order to more readily enter the silicon dioxide lattice structure. If the narrow width, such as the 4000 Å in the example, is sufficiently narrow to inhibit the free movement of the oxygen molecules in the preferred direction, then the degree of oxidation would be correspondingly reduced.

As chip density increases, each layer or component is designed to be smaller and thinner. This is particularly the case of the field oxide used to isolate adjacent devices. If a standard LOCOS process is used, the bird's beak length approaches the critical device dimensions, and a large area on the chip is lost due to these bird's beak transition regions. Thus, there is a need to build field oxide structures with reduced bird's beaks.

In order to produce narrow field regions and reduce bird's beak effect, a poly buffer LOCOS process was developed. In the poly buffer LOCOS process (PBL), a pad oxide layer is grown, followed by a poly layer and by a nitride layer. The poly layer is placed to absorb the stress created by the nitride film. This is followed by the patterning of the nitride with photoresist in order to define active areas and field regions. The nitride is etched away through the photoresist, after which the resist was striped. This leaves areas of nitride which were defined by the photoresist. Field oxide is grown on parts of the area not covered by nitride, so that the areas of nitride as defined by the photoresist are used to define the active areas.

The nitride pattern is stripped after the growth of the field oxide, along with the underlying buffer poly. The growth of field oxide consumes the buffer poly in the field areas of exposed regions, so the stripping of the nitride and underlying buffer poly has eliminated the buffer poly.

The PBL process permits the use of a thicker nitride layer since the buffer poly absorbs the additional stress. The increased thickness of the nitride also may result in a thinning of those field areas having a narrow width dimension. One effect of doping silicon is that the doped material is more readily oxidized.

SUMMARY OF THE INVENTION

In accordance with the present invention, the thinning effect of narrow field areas is reduced by enhancing the oxidation characteristics of the substrate. This is accomplished in a LOCOS process by photomasking selected areas of the wafer. The photomask step may be advantageously performed subsequent to the step of forming a pattern of nitride. An impurity is then added to the substrate material in order to establish a more rapid oxidation rate, followed by stripping of the photoresist. Subsequent to growth of the field oxide, most impurity is oxidized. It is preferable that the oxidation leave little electrical effect from the impurity. It is sometimes advantageous to use an electrically neutral, impurity, so that the impurity has little electrical effect in any case.

In accordance with a further aspect of the invention, the thinning effect of narrow field areas is reduced by enhancing the oxidation characteristics of a buffer poly layer. This is accomplished in a poly buffer LOCOS (PBL) process by photomasking selected areas of the wafer subsequent to the step of forming a pattern of nitride. The exposed buffer poly is then doped in order to establish a more rapid oxidation rate, followed by stripping of the photoresist. Subsequent to growth of the field oxide, most of the doped material is oxidized, leaving little electrical effect from the dopants.

The poly buffer layer is advantageous in the case where conductivity type dopants such as phosphorous and arsenic are used as oxidation rate enhancers since conductive doping of a semiconductor material such as silicon under field oxide as n type (or p type) can defeat the whole purpose of isolating NMOS devices.

It is also possible to implant the silicon with materials which do not change the conductivity type of the silicon, but yet have an effect on the oxidation rate of the silicon. Is the case of species like Ge and Cl, the silicon is not conductively doped, but oxidation is enhanced where the impurity is implanted. It is further conceivable that oxidation inhibiting impurity may be added to the silicon in selected regions, in order to allow regions other than the selected regions to oxidize more than the selected regions. Germanium has other potential advantages, namely:

Experiments indicate that it can slow down boron diffusion in silicon, which helps reduce boron encroachment into active regions.

Ge is a group 4 atom and is therefore electrically inactive in Si lattice.

DETAILED DESCRIPTION OF THE PREFERRED EMBODIMENTS

Figure 1:
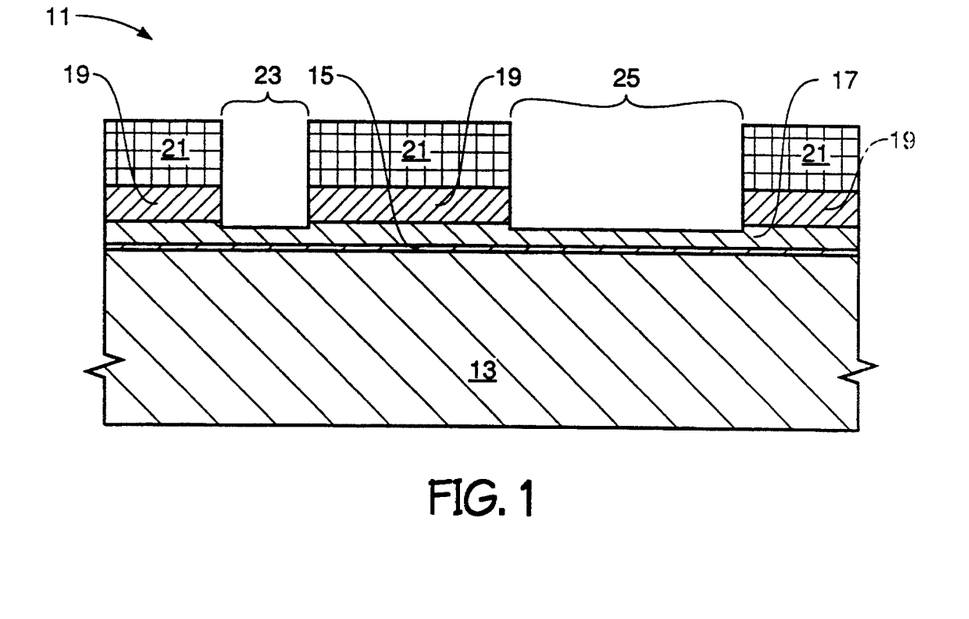
FIG. 1 (prior art) shows a semiconductor wafer, in cross-section, prepared for field oxide formation using the poly buffer LOCOS (PBL) process.

Referring now to FIG. 1, a semiconductor wafer 11 has been prepared with a substrate 13 over which a thin layer of dielectric 15 is grown. A layer of buffer semiconductor material 17 is then deposited over the thin layer of dielectric. The thin layer of dielectric 15 is known as pad dielectric. Additional dielectric material, such as nitride 19 is deposited over the buffer material 17 and etched through a photoresist pattern 21 in order to define field oxide regions 23, 25. The use of the nitride 19 as a pattern to define field oxide regions is typical of LOCOS defined field oxide, and the buffer material 17 is typical of the poly buffer LOCOS (PBL) process.

In the preferred embodiment of the invention, the wafer 11 is a silicon starting wafer, or a silicon on saphire (SOS) wafer, and the pad dielectric 15 is silicon dioxide which is typically grown on the surface of the wafer 11. The pad dielectric 15 is therefore known as pad ox. The nitride 19 in such processes is typically silicon nitride. In the case of CMOS circuits, the establishment of p or n wells has usually been accomplished prior to the growth of pad dielectric 15 and subsequent field oxide definition.

The buffer semiconductor material 17 is typically silicon, and usually polysilicon. For this reason, the buffer material 17 is called poly buffer. Amophorous silicon would also perform the function of the buffer material 17. Single crystal silicon would also function as a buffer, with the primary drawback being process difficulty in forming a thin layer of single crystal silicon whose primary purpose is to be oxidized anyway.

Figure 2:
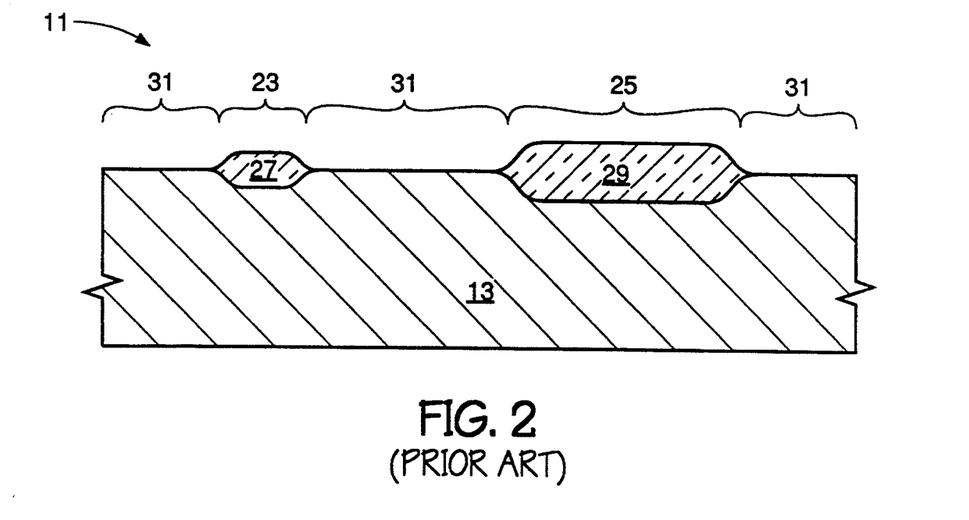
FIG. 2 (prior art) shows the semiconductor wafer of FIG. 1 with the field oxide defined, with narrow regions exhibiting a thinning effect.

Subsequent to depositing the nitride 19 to define field oxide regions 23, 25, the resist 21 is stripped and field oxide 27, 29 is grown in the field oxide regions 23, 25. The nitride 19 masks off the substrate 13 in order to prevent regions under the nitride 19 from being grown as field oxide, thus defining active areas 31.

In a typical prior art LOCOS processes, the pad ox is thermally grown to be 200 Å in thickness, and the nitride is 1700 Å in thickness. In the typical PBL process, the growth of the pad ox 15 is reduced to 100 Å. The poly buffer layer 17 has a typical thickness of 500 Å, and the nitride layer 19 has a typical thickness of 2400 Å. The poly buffer layer 17 allows the nitride to be made thicker.

The increased thickness of the nitride also results in a thinning of those field areas having a narrow width dimension. It is understood that, since the wafer is generally planar, the narrow dimension can extend in various geometries, so that "width" is meant only to refer to the narrowest dimension at any given location on the particular field area, rather than from a single fixed geometrical prospective. The reason is simple; the thinning is the result of the close proximity of two nitride sidewalls.

Figure 3:
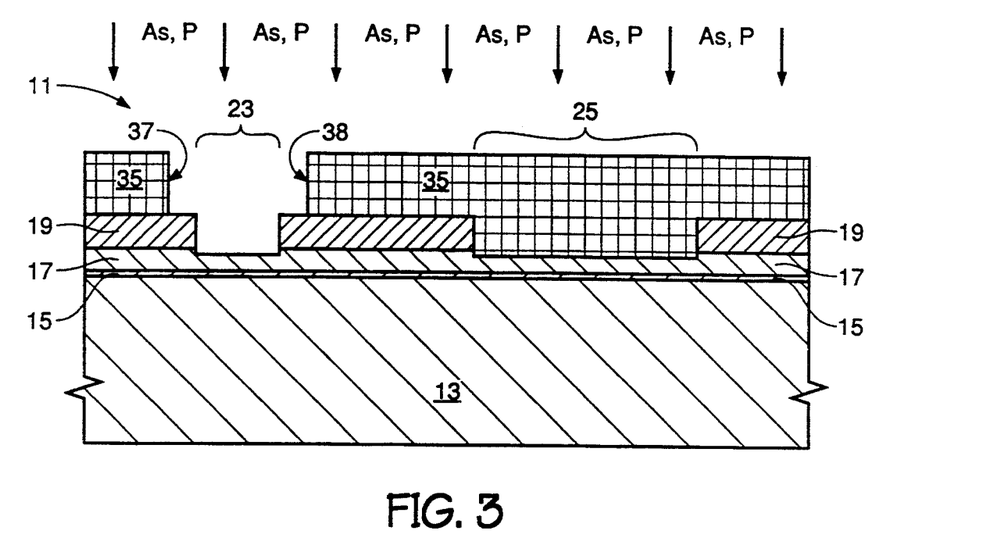
FIG. 3 shows an implant step, whereby narrow regions of the semiconductor wafer of FIG. 1, are doped.

Referring to FIG. 3, a photoresist layer 35 is deposited and patterned in order to expose the defined narrow regions, such as region 23. Since the nitride 19 defines the boundaries of the field regions 23, 25, registration of the patterning of photoresist layer 35 is not critical, as evidenced by the setback 37, 38, of the patterned resist 35 over the nitride 19.

The wafer, and more particularly the poly buffer layer 17, is then doped, preferably by implant, although diffusion may in the future prove to be advantageous in this process. Preferred dopants are arsenic and phosphorous, although the particular use of n type dopants is not especially used for its electrical conductivity characteristics as combined with silicon. The significant aspect of this doping step is to dope conductive or semiconductor material which will eventually be oxidized.

In the preferred embodiment of the invention, the implant is applied with sufficient energy to penetrate the poly 17. It is possible to drive the implant with sufficient energy to penetrate the underlying wafer substrate 13 to a depth of anticipated oxidation. In the preferred embodiment we just need to implant the poly. This poly layer will oxidize faster, and there is no need to implant the substrate. The implanted atoms are chosen for their characteristic of promoting oxidation of the silicon. In our experimental designs, the implant is performed at dosages in the range of 1E13 to 1E15, at energy levels of 10 to 50 KeV. It is anticipated that other dosages and ranges will be used as the process is further developed and as different dimensions of the oxide regions are desired. The implant dosage would therefore preferably be in the range of 1E12 to 1E16 atoms/cm$^2$, and the implant would preferably be applied at a dosage of between 2 and 200 KeV.

Figure 4:
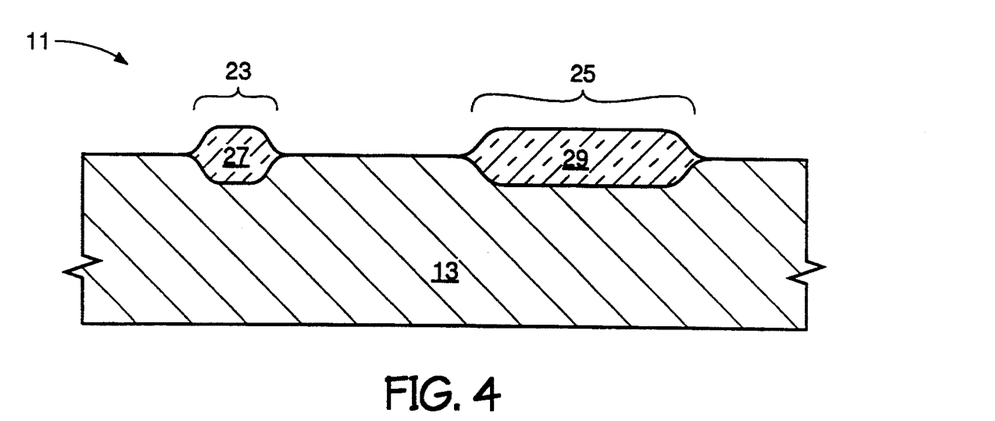
FIG. 4 shows the structure of FIG. 3 after growth of field oxide.

Referring to FIG. 4, the resist 35 is then stripped and the wafer 11 is oxidized as defined by the pattern of the nitride 19 to establish the field oxide. The dopant applied to the poly buffer layer 17 promotes oxidation of the silicon at those locations, thus compensating for the thinning effect at narrow field regions 23. The nitride 19 and unoxidized poly buffer layer 17 may then be stripped and further process steps may be performed.

Figure 5:
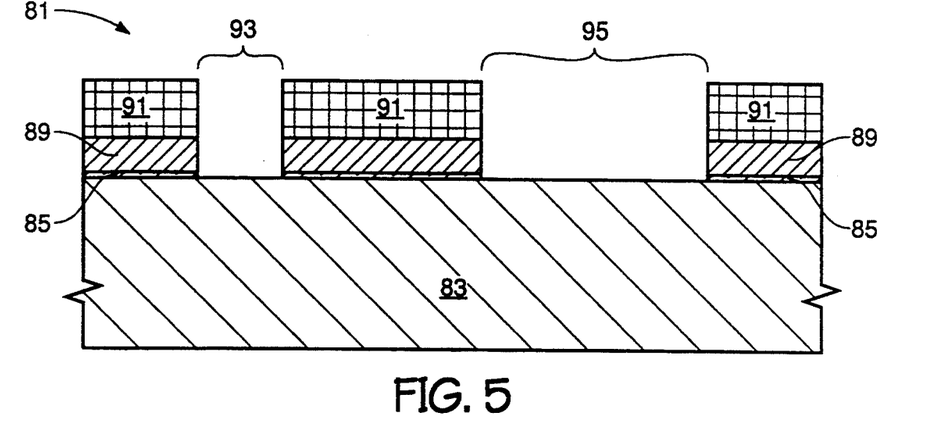
FIG. 5 shows a semiconductor wafer, in cross-section, prepared with the field oxide defined in narrow and wide regions.

FIG. 5 shows a semiconductor wafer 81 prepared in accordance with the LOCOS process. The wafer 81 consists of a substrate 83 over which a thin layer of pad dielectric 85 is deposited. The pad dielectric 85 is preferably oxide, which is grown from the wafer silicon as silicon dioxide. Additional dielectric material, such as nitride 89 is deposited over the thin layer of pad dielectric 85 and etched through a photoresist pattern 91 in order to define field oxide regions 93, 95. The nitride 89 is preferably a field-patterning silicon nitride layer, having a thickness with the range of 1500 Å to 2000 Å in thickness is deposited on top of pad oxide layer 85.

In the preferred embodiment of the invention, the wafer 81 is a silicon starting wafer, or a silicon on saphire (SOS) wafer, and the pad dielectric 85 is silicon dioxide which is typically grown on the surface of the wafer 81, and is known as pad ox. The nitride 89 in such processes is typically silicon nitride. In the case of CMOS circuits, the establishment of p or n wells has usually been accomplished prior to the growth of pad dielectric 85 and subsequent field oxide definition.

Figure 6:
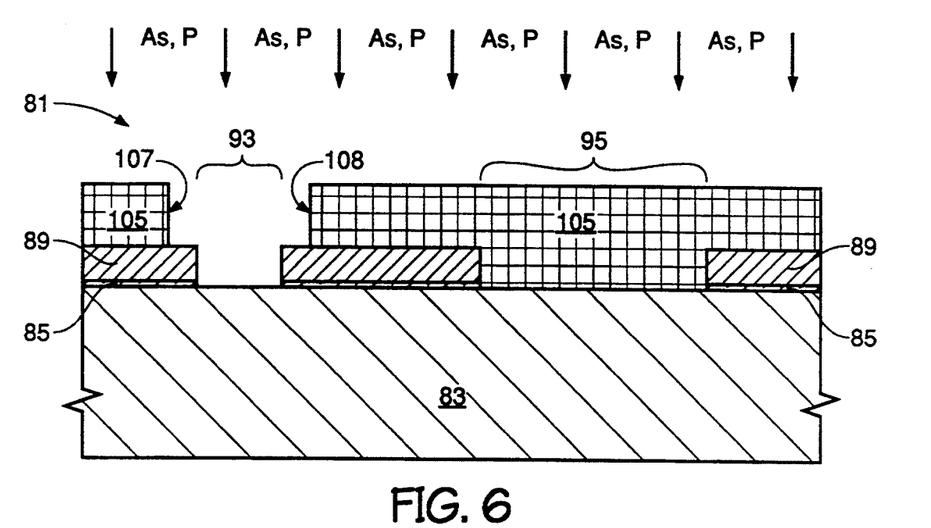
FIG. 6 shows an implant step, whereby narrow regions of the semiconductor wafer of FIG. 1, are implanted with an oxidation enhancement dopant.

Referring to FIG. 6, a photoresist layer 105 is deposited and patterned in order to expose the defined narrow regions, such as region 93. Since the nitride 89 defines the boundaries of the field regions 93, 95, registration of the patterning of photoresist layer 105 is not critical, as evidenced by the setback 107,108, of the patterned resist 105 over the nitride 89.

The wafer is then doped, preferably by implant, although diffusion may in the future prove to be advantageous in this process. Preferred dopants are arsenic and phosphorous, although the particular use of n type dopants is not especially used for its electrical conductivity characteristics as combined with silicon. The significant aspect of this doping step is to dope conductive or semiconductor material which will eventually be oxidized.

In the preferred embodiment of the invention, the implant is applied with sufficient energy to penetrate the underlying wafer substrate 83 to a depth of anticipated oxidation. The implanted dopants are chosen for their characteristic of promoting oxidation of the silicon.

It has been found that the oxidation of silicon will have an effect of driving a dopant to a level below the oxidized silicon layer. This can be either advantageous or disadvantageous, depending on whether dopants are desired below the oxidized layer. If dopants are desired, then the oxidation may be performed at higher temperatures. Further driving of the dopants may be achieved by causing the oxidation at the selected temperature to occur more slowly, as by using a drier atmosphere or an atmosphere with less oxygen. On the other hand, if the driving of implants below the oxidized layer is not desired, then one would attempt to oxidize more rapidly and at lower temperatures.

Further control of the driving of implant material into the substrate below field areas may be achieved by using a second impurity such as germanium which retards the diffusion of the first impurity into the wafer. This can be used to either control the level of concentration of the first impurity, or to limit the migration of the first impurity into the substrate.

Typically, phosphorus or boron would be driven into the substrate by the oxidation. Germanium is particularly effective in limiting the driving of boron onto the substrate.

Figure 7:
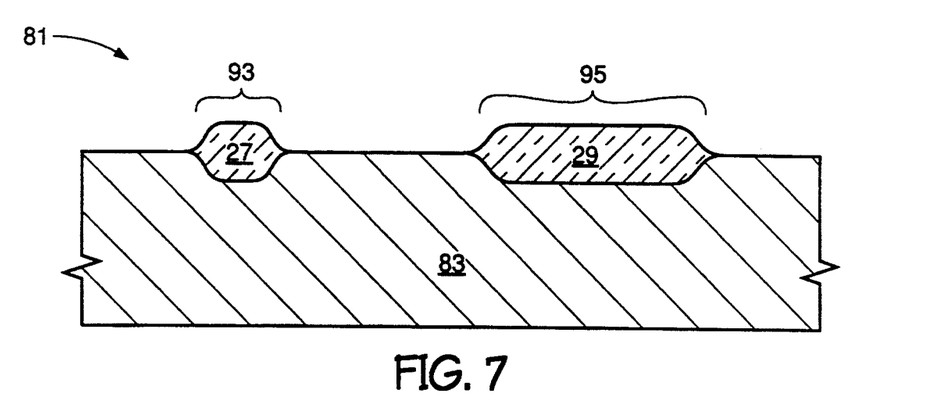
FIG. 7 shows the structure of FIG. 6 after growth of field oxide.

Referring to FIG. 7, the resist 105 is then stripped and the wafer 81 is oxidized as defined by the pattern of the nitride 89 to establish the field oxide. The dopant applied to the substrate 83 promotes oxidation of the silicon at those locations, thus compensating for the thinning effect at narrow field regions 93. The nitride 89 may then be stripped and further process steps may be performed.

Figure 8:
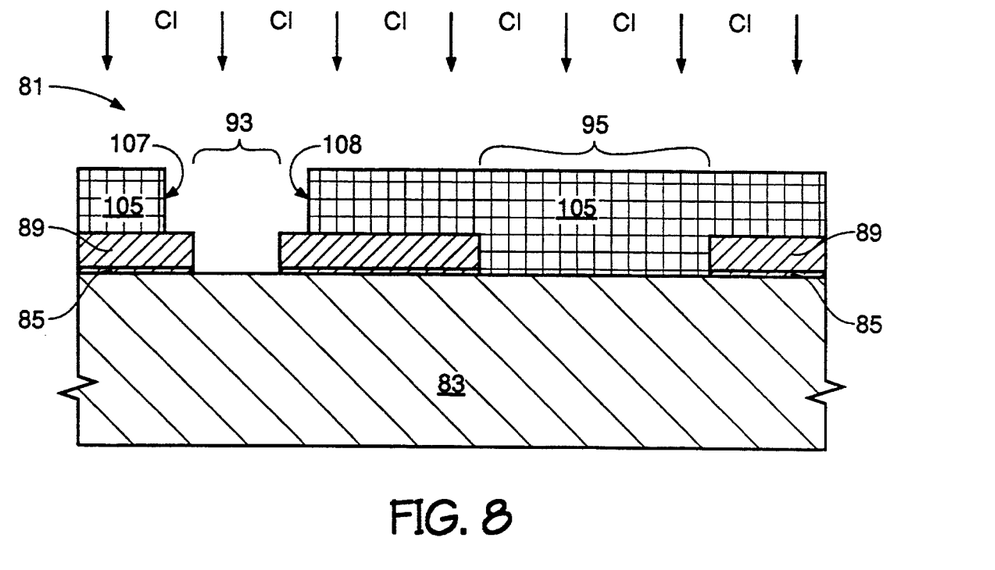
FIGS. 8 and 9 show the use of chlorine or Ge to promote oxidation of the wafer in the structures of FIGS. 3 and 6, respectively.
Figure 9:
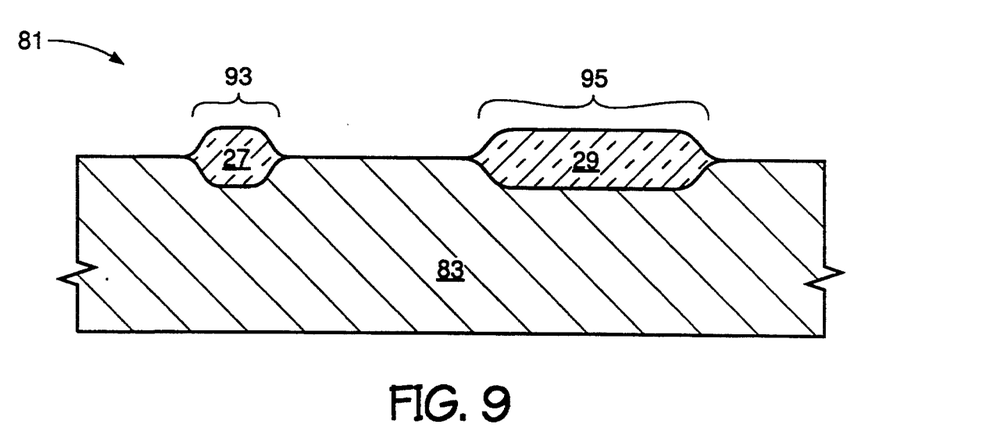

While the invention has been discussed with respect to the use of dopants affecting conductive type of unoxidized semiconductor material as the oxidation promoting impurity, it is possible to apply other types of impurities to promote oxidation. As an example, FIGS. 8 and 9 show the use of a halogen, specifically chlorine, to promote oxidation of the wafer.

Figure 10:
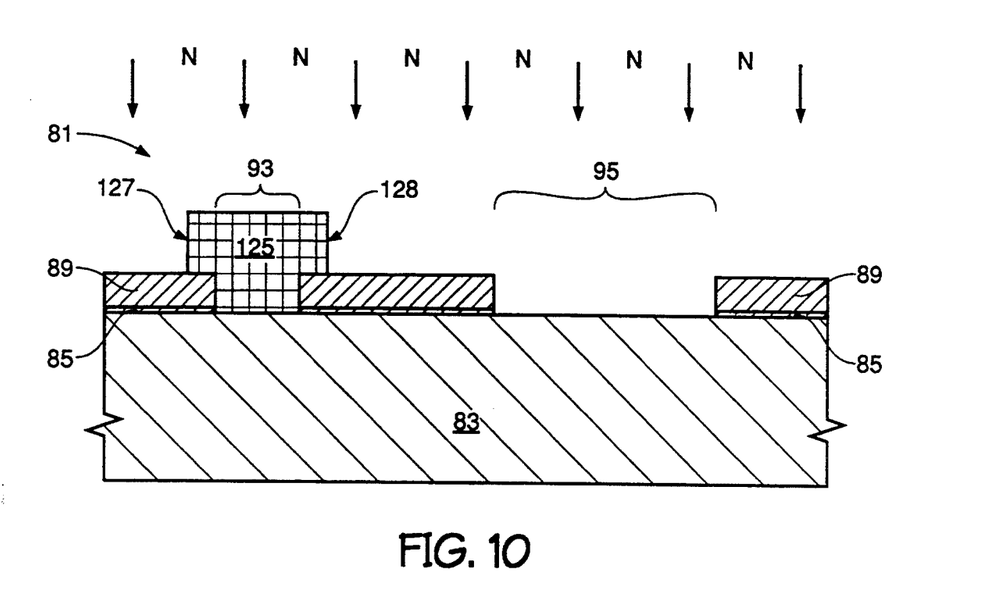
FIGS. 10 and 11 show the use of an impurity such as nitrogen to retard oxide growth except at narrow field regions.

Referring to FIG. 10, the wafer of FIG. 5 is masked with a photoresist layer 125 is deposited and patterned in order to mask defined narrow regions of the wafer, shown as region 93. Since the nitride 89 defines the boundaries of the field regions 93, 95, registration of the patterning of the photoresist layer 125 is again not critical, as evidenced by the setbacks 127, 128 of the patterned resist 125 over the nitride 89. The photoresist layer 125 is used to define regions of field isolation oxide to be reduced in thickness, which are subsequently reduced in thickness by etching to remove a pre-determined fraction of field oxide present.

The wafer is then doped, by implant or diffusion. The dopants are selected to retard oxidation, so that the undoped regions (93) oxidize more readily. As is the case with the oxidation promoting dopant, the significant aspect of this doping step is to dope conductive or semiconductor material which will eventually be oxidized. Unlike the case of the embodiment of FIGS. 6 and 7, the implanted dopants are chosen for their characteristic of retarding oxidation of the silicon.

While the preferred embodiment uses oxidation enhancement impurities, such as shown in FIGS. 6 and 7, impurities may be use to reduce the oxidation rate in selected regions, thereby allowing growth in the narrow field regions to equal that of wide field areas in the selected regions. It is possible to use nitrogen as an impurity to retard oxidation. The combination of nitrogen with silicon would produce silicon nitride molecules. Si3N4 is a known blocker for O diffusion. It is believed that a medium dose of nitrogen implanted into silicon would, at elevated temperatures (such as those used for oxidation), form a non-stoichiometric silicon nitride which would retard the oxidation of silicon by reducing the amount of silicon available to react with oxygen.

Figure 11:
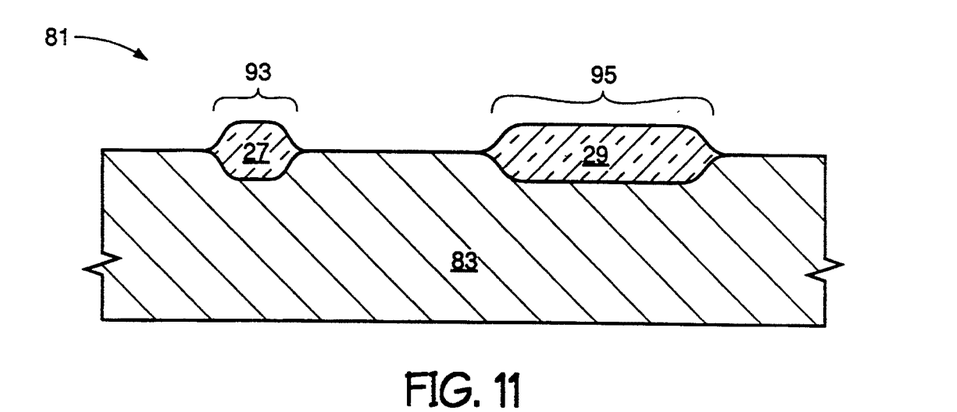

Referring to FIG. 11, the resist 125 is then stripped and the wafer 81 is oxidized as defined by the pattern of the nitride 89 to establish the field oxide. The dopant applied to the substrate 83 retards oxidation of the silicon at those locations, thus allowing the narrow field regions 93 to oxidize sufficiently to overcome the thinning effect. The nitride 89 may then be stripped and further process steps may be performed.

While several embodiments of the invention has been discussed with respect to the use of particular dopants, it is anticipated that variations of the process can be accomplished without deviating from the invention. Accordingly, the invention is intended to be limited only by the claims.

We claim:

1. Method of forming semiconductor circuit devices which include, as a part of each device, a plurality of active regions separated by field regions, wherein some of the field regions have a narrow width dimension as compared to other field regions on the device, the method comprising:
    a) preparing a semiconductor wafer and establishing the wafer as a substrate;
    b) forming an initial dielectric layer over the substrate;
    c) forming a buffer layer of semiconductor material over the initial dielectric layer;
    d) depositing a further dielectric layer over the buffer layer;
    e) photopatterning the further dielectric layer in order to define said field regions at locations defined by an absence of said further dielectric region;
    f) selecting areas on the wafer for retardation of an oxidation rate of said other field regions;
    g) applying photoresist and patterning the photoresist in order to expose said selected areas to an impurity while covering the field regions that have said narrow width dimension;
    h) applying an impurity to said substrate at said exposed selected areas;
    i) stripping said patterned photoresist;
    j) oxidizing said defined field regions, thereby forming field oxide at said defined field regions, whereby the impurity retards the oxidation rate at said selected areas so that the oxidation growth in the exposed selected regions is equal to the oxidation growth in the field regions having narrow width dimension, thereby reducing a thinning effect at said field regions having narrow width dimension; and
    k) removing said further dielectric layer.

2. The method of claim 1 wherein said impurity used for the implant at said selected areas comprises nitrogen.

3. Method of forming semiconductor circuit devices formed on a semiconductor wafer substrate which include, as a part of each device, a plurality of active regions separated by field regions, wherein some of the field regions have narrow width dimension as compared to other field regions on the device, wherein an initial dielectric layer is formed over the substrate, a buffer layer of semiconductor material is formed over the initial dielectric layer, a further dielectric layer is deposited and photopatterned in order to define field regions, field oxide is formed in said defined field regions, the formation of field oxide consuming the buffer layer at the field regions, and removing said further dielectric layer, the method further comprising:
    a) selecting areas on the wafer for retardation of an oxidation rate of the other field regions;

b) applying photoresist and patterning the photoresist in order to expose said selected areas to an impurity while covering said field regions having said narrow width dimension; and c) applying an impurity to said substrate at said exposed selected areas, whereby the impurity retards the oxidation rate at said selected areas so that the oxidation growth in the exposed selected regions is equal to the oxidation growth in the field regions having narrow width dimension, thereby reducing a thinning effect at said field regions having a narrow width dimension.

4. The method of claim 3 wherein said impurity comprises nitrogen.

5. A LOCOS field isolation process for sub-micron circuitry to be constructed on a silicon substrate, comprising the following sequence of steps, which begins following the creation of an N-well and a P-well within said substrate:

a) creation of a pad oxide layer on top of said n-well and p-well regions;

b) deposition of a silicon nitride layer on top of the pad oxide layer;

c) masking said silicon nitride layer in future active regions with photoresist, thereby defining first and second field regions, wherein said second field regions have a narrow width dimension as compared to said first field regions;

d) anisotropically etching away those portions of said thick silicon nitride layer that are not subject photoresist, with remnants of the thick silicon nitride layer remaining wherever covered with photoresist;

e) stripping the photoresist used to mask said thick silicon nitride layer;

f) selecting areas on the wafer for retardation of an oxidation rate of said first field regions;

g) performing a masked implant at said selected areas, the implant retarding the oxidation rate of selected field regions in said selected areas;

h) thermally growing field oxide on the surface of said substrate except where masked with said nitride layer remnants, whereby said retarded oxidation rate at said selected areas is such that the oxidation growth in the selected areas is equal to the oxidation growth in the second field regions which thereby results in a reduced oxide thinning effect at said second field regions having said narrow width dimension; and i) removing said nitride layer remnants with a nitride etch.

6. The process of claim 5 wherein said impurity comprises nitrogen.

7. Method of forming semiconductor circuit devices which include, as a part of each device, a plurality of isolation regions having a thick oxide layer, wherein some of the isolation regions have a narrow width dimension as compared to other isolation regions on the device, the method comprising:

a) providing a semiconductor substrate;

b) creation of a pad oxide layer;

c) deposition of a silicon nitride layer on top of the pad oxide layer;

d) masking said silicon nitride layer in future active regions with photoresist, thereby defining field regions;

e) anisotropically etching away those portions said thick silicon nitride layer that are not subjacent photoresist, with remnants of the thick silicon nitride layer remaining wherever covered with photoresist;

f) stripping the photoresist used to mask said thick silicon nitride layer;

g) selecting areas on the wafer for retardation of an oxidation rate of the other field regions;

h) performing a masked implant at said selected areas, thereby reducing a thinning effect at field regions having a narrow width dimension;

i) thermally growing field oxide on the surface of said substrate except where masked with said nitride layer remnants; and j) removal of said nitride layer remnants with a nitride etch.

8. Method of forming semiconductor circuit devices formed on a semiconductor wafer substrate which include, as a part of each device, a plurality of active regions separated by field regions, wherein some of the field regions have a narrow width dimension as compared to other field regions on the device, wherein an initial dielectric layer is formed over the substrate, a further dielectric layer is deposited and photopatterned in order to define field regions, field oxide is formed in said defined field regions, and removing said further dielectric layer, the method further comprising:

a) selecting areas on the wafer for retardation of an oxidation rate of the other field regions;

b) applying photoresist and patterning the photoresist in order to exposed said selected areas to an impurity while covering up said field regions having said narrow width dimension;

c) applying an impurity to said substrate at said exposed field regions, whereby the impurity applied to exposed field regions results in a retarded oxidation rate; and d) removing said further dielectric layer.

9. The method of claim 8 wherein said impurity comprises nitrogen.

* * * * *